United States Patent
Fajarmega et al.

(10) Patent No.: US 12,136,931 B2
(45) Date of Patent: Nov. 5, 2024

(54) SEMICONDUCTOR DEVICE, ANALOG-TO-DIGITAL CONVERTER AND ANALOG-TO-DIGITAL CONVERTING METHOD

(71) Applicant: Renesas Electronics Corporation, Tokyo (JP)

(72) Inventors: Pratama Fajarmega, Tokyo (JP); Tatsuo Nishino, Tokyo (JP); Takehiro Shimizu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 183 days.

(21) Appl. No.: 17/983,576

(22) Filed: Nov. 9, 2022

(65) Prior Publication Data
US 2023/0147156 A1 May 11, 2023

(30) Foreign Application Priority Data
Nov. 9, 2021 (JP) ................. 2021-182896

(51) Int. Cl.
| | | |
|---|---|---|
| H03M 1/46 | (2006.01) | |
| H03M 1/06 | (2006.01) | |
| H03M 1/10 | (2006.01) | |
| H03M 1/38 | (2006.01) | |
| H03M 1/76 | (2006.01) | |

(52) U.S. Cl.
CPC ......... *H03M 1/462* (2013.01); *H03M 1/0636* (2013.01); *H03M 1/069* (2013.01); *H03M 1/1009* (2013.01); *H03M 1/38* (2013.01); *H03M 1/468* (2013.01); *H03M 1/765* (2013.01)

(58) Field of Classification Search
CPC .... H03M 1/462; H03M 1/0636; H03M 1/765; H03M 1/069; H03M 1/468; H03M 1/38; H03M 1/1009
USPC .................. 341/118, 120, 155, 161, 172
See application file for complete search history.

(56) References Cited

U.S. PATENT DOCUMENTS

| | | | | |
|---|---|---|---|---|
| 7,605,741 B2 * | 10/2009 | Hurrell | ............... | H03M 1/1047 341/118 |
| 8,164,504 B2 * | 4/2012 | Cho | .................... | H03M 1/0678 341/172 |
| 9,692,441 B2 | 6/2017 | Takada et al. | | |

FOREIGN PATENT DOCUMENTS

JP         2017017665 A        1/2017

* cited by examiner

*Primary Examiner* — Khai M Nguyen
(74) *Attorney, Agent, or Firm* — SCULLY, SCOTT, MURPHY & PRESSER, P.C.

(57) ABSTRACT

A semiconductor device includes an analog-to-digital converter configured to perform a process of sampling an analog input signal and a successive-approximation process, execute an AD conversion process, and output a digital output signal. The AD converter includes an upper DAC, a redundant DAC, a lower DAC, a comparator configured to compare a comparative reference voltage and output voltages of the upper DAC, the redundant DAC and the lower DAC, a control circuit configured to control successive approximations by the upper DAC, the redundant DAC and the lower DAC based on the comparison result of the comparator, and generate a digital output signal, and a correction circuit. The correction circuit includes an error correction circuit configured to correct an error of the upper bit with the redundant bit, and an averaging circuit configured to calculate an average value of conversion values of a plurality of the lower bits supplied multiple times.

7 Claims, 10 Drawing Sheets

SEMICONDUCTOR DEVICE, ANALOG-TO-DIGITAL CONVERTER AND ANALOG-TO-DIGITAL CONVERTING METHOD

CROSS-REFERENCE TO RELATED APPLICATIONS

The subject application claims priority to Japanese Patent Application No. 2021-182896 filed on Nov. 9, 2021. The disclosure of Japanese Patent Application No. 2021-182896, including the specification, drawings and abstract is incorporated herein by reference in its entirety.

BACKGROUND

The present invention relates to a semiconductor device, and is applicable to a semiconductor device comprising, for example, a successive-approximation analog-to-digital (AD) converter.

A microcontroller, a system-on-a-chip (SoC) or the like comprises an AD converter configured to convert an analog signal input from an external device into a digital signal to be processed by an internal central processing unit (CPU). A well-known example of an AD converter is the successive-approximation AD converter. The successive-approximation AD converter mainly comprises a digital-to-analog converter (DAC), a comparator, a successive-approximation logic circuit and the like. The successive-approximation AD converter samples the input analog signal, and performs a successive-approximation process on a sampling value to output a digital signal as a result of the successive approximation.

There are disclosed techniques listed below.
[Patent Document 1] Japanese Unexamined Patent Application Publication No. 2017-17665

Conventionally, measures have been considered to reduce effect of noise in the successive-approximation AD converter. For example, Patent Document 1 discloses a configuration in which a reference voltage is generated based on an expected value of an AD conversion process, and in which the reference voltage is supplied to the comparator configured to perform the successive-approximation process. A value obtained by averaging multiple AD conversion results is used as the expected value.

SUMMARY

AD conversion is successively performed multiple times on the same channel of a channel-selective analog input, and an average of the obtained conversion values is retained in a data register. Using the resulting average value may improve precision of the AD conversion depending of the noise component. However, sampling and successive-approximation processes are performed multiple times, causing an increase in processing time.

Other issues and novel features will become apparent from the description in the present specification and accompanying drawings.

The following is a brief overview of a representative embodiment disclosed in the present application. That is, the semiconductor device comprises a port to which an analog input signal is input, and a successive-approximation AD converter configured to perform a process of sampling the analog input signal and a successive-approximation process, execute an AD conversion process, and output a digital output signal. The AD converter comprises: an upper DAC; a redundant DAC; a lower DAC; a comparator configured to compare a comparative reference voltage and output voltages of the upper DAC, the redundant DAC and the lower DAC; a control circuit configured to control successive approximations by the upper DAC, the redundant DAC and the lower DAC based on the comparison result of the comparator and generate a digital output signal; and a correction circuit. The correction circuit comprises an error correction circuit configured to correct an error of an upper bit with a redundant bit, and an averaging circuit configured to calculate an average value of conversion values of a plurality of the lower bits supplied multiple times.

According to the above-described semiconductor device, it is possible to reduce the processing time.

DETAILED DESCRIPTION

Hereinafter, an embodiment and modification examples of the present invention will be described with reference to the drawings. Note that, in the following description, the same components are denoted by the same reference sign, and redundant descriptions thereof may be omitted as appropriate.

Figure 1:
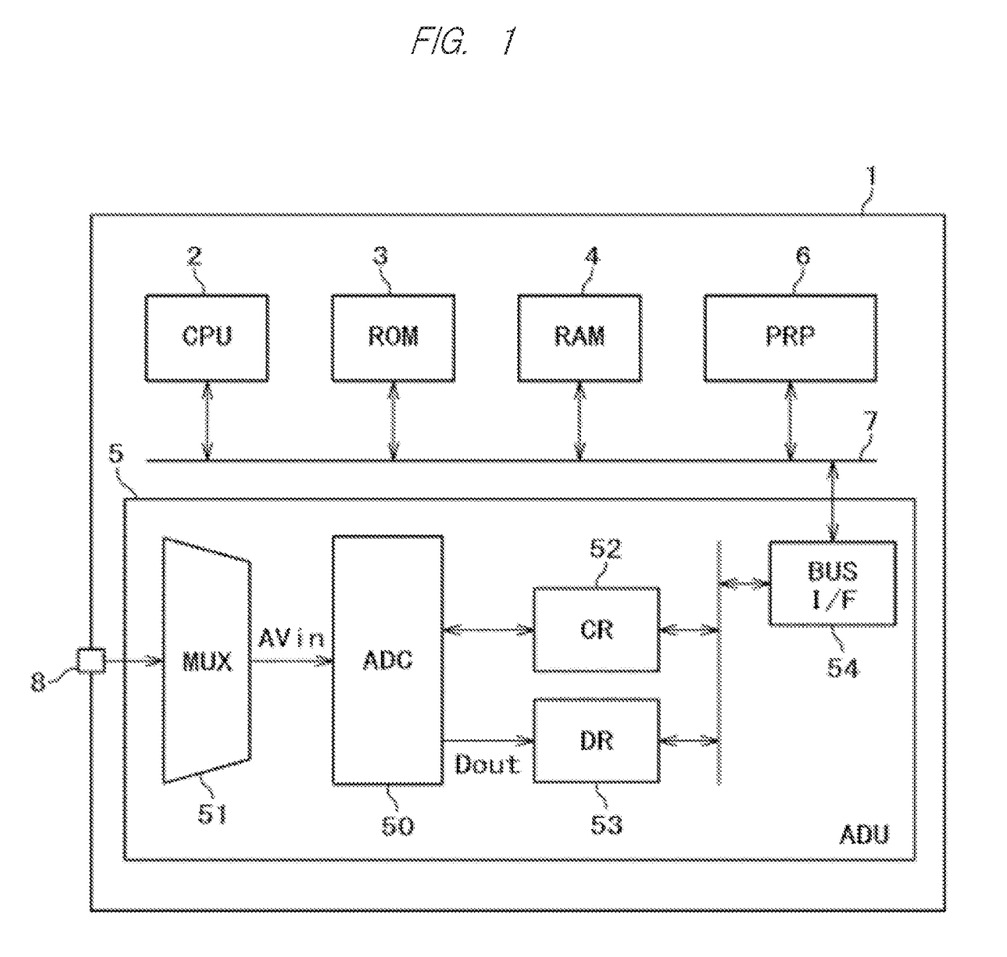
FIG. 1 is a block diagram showing a configuration example of a microcontroller in an embodiment.

FIG. 1 is a block diagram showing a configuration example of a microcontroller in the present embodiment. Note that the microcontroller is given as an example of a semiconductor device, and may be another semiconductor device including an AD converter of the present embodiment.

As shown in FIG. 1, a microcontroller 1 in the present embodiment comprises a central processing unit (CPU) 2, a ROM 3, a RAM 4, an AD converter (ADU) 5, other peripheral circuits (PRP) 6, a bus 7, and an analog port 8.

The CPU 2, the ROM 3, the RAM 4, and the peripheral circuits 6 are connected to one another via the bus 7. The AD converter 5 has an input terminal connected to the analog port 8, and an output terminal connected to the bus 7.

The CPU 2 is an arithmetic processor configured to achieve functions necessary for the microcontroller 1. The ROM 3 is a non-volatile memory such as a flash memory in which various programs to be executed by the CPU 2 are stored. The RAM 4 is a volatile memory such as an SRAM in which data handled by the CPU 2 are stored. The CPU 2 accesses the ROM 3 and the RAM 4 to execute the various programs, and executes an arithmetic process on AD conversion results obtained by the AD converter 5 and input/output signals of the peripheral circuits 6.

For example, the AD converter 5 comprises a successive-approximation AD converter (ADC) 50, an analog multiplexer (MUX) 51, a control register (CR) 52, a data register (DR) 53, and a bus interface (BUS I/F).

The AD converter 50 performs the AD conversion on an analog input signal (AVin) input from the analog port 8 via the analog multiplexer 51, and outputs a digital output signal which is an AD conversion result to the data register 53. The analog multiplexer 51 selects one analog port among a plurality of analog ports, and inputs the analog signal to the AD converter 50. The data register 53 retains the AD conversion result, and the CPU 2 can read contents of the data register 53 via the bus 7 and the bus interface 54. The control register 52 retains control information of the AD converter 5 written from the CPU 20, and the CPU 2 can write to the control register 52 and read the contents of the control register 52 via the bus 7 and the bus interface 54.

Figure 2:
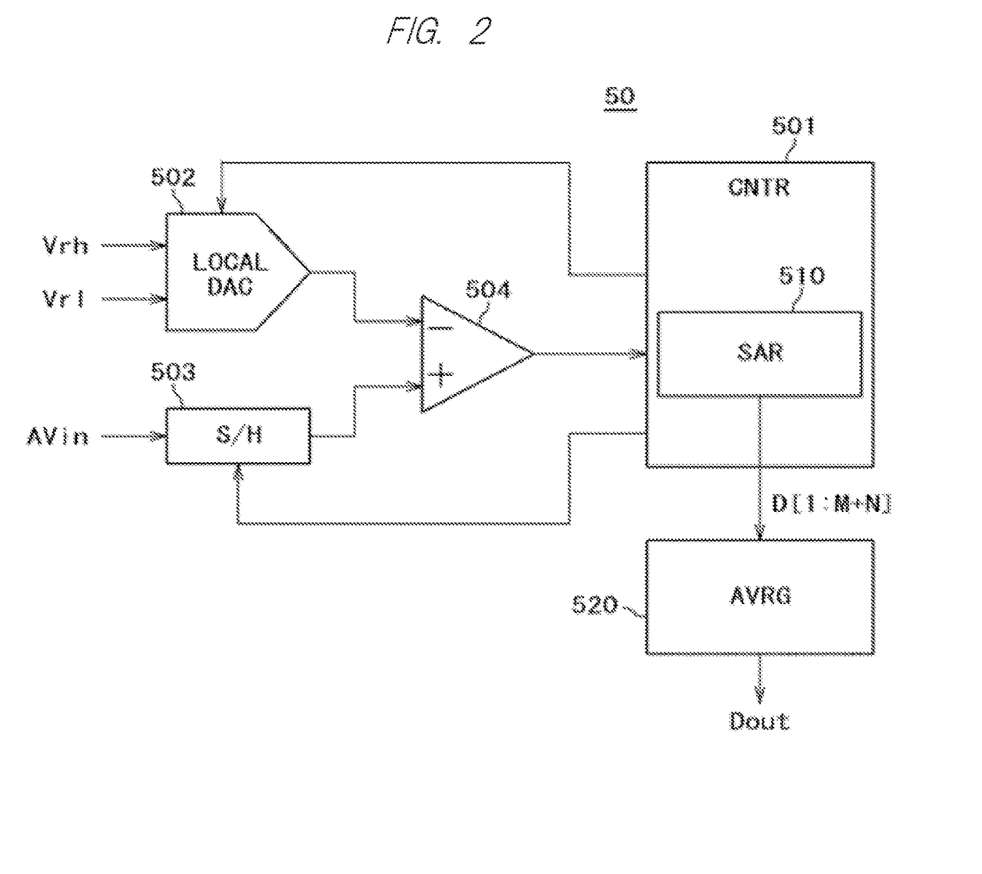
FIG. 2 is a block diagram schematically showing a configuration of an AD converter in a comparative example.
Figure 3:
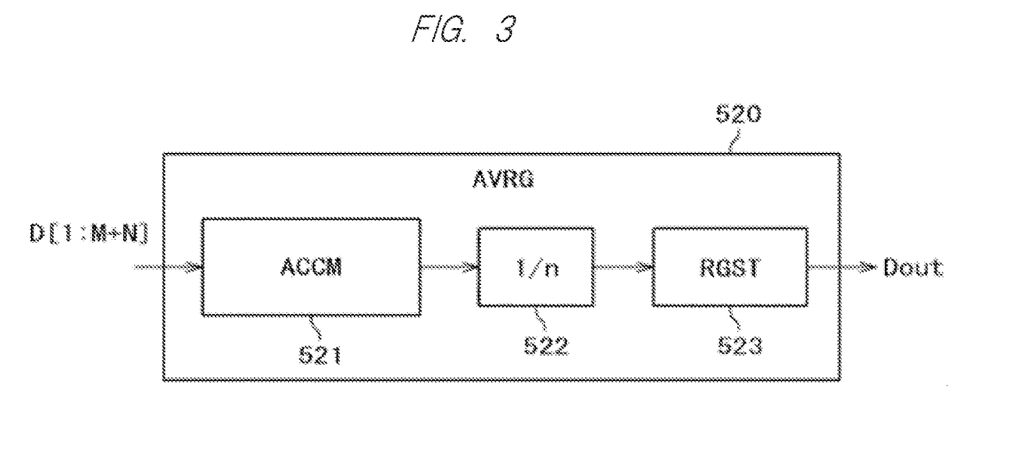
FIG. 3 is a block diagram showing a configuration example of an averaging circuit shown in FIG. 2.

First, in order to clarify the present embodiment, a configuration of the AD converter 50 in a comparative example will be described with reference to FIGS. 2 and 3. FIG. 2 is a block diagram schematically showing the configuration of the AD converter in the comparative example. FIG. 3 is a block diagram showing a configuration example of an averaging circuit shown in FIG. 2.

As shown in FIG. 2, the AD converter 50 has a control circuit (CNTR) 501, a local digital-to-analog converter (DAC) 502, a sample-and-hold circuit (S/H) 503, a comparator 504, and an averaging circuit (AVRG) 520. The AD converter 50 is configured as an (M+N) bit AD converter. Here, M and N are integers of 2 or more. The analog signal (AVin) is input to the AD converter 50. The AD converter 50 performs successive approximation (binary search) on the analog signal (AVin) to perform the AD conversion on the analog signal (AVin) and output a digital output signal (bout).

The control circuit 501 controls operations of the local DAC 502, the sample-and-hold circuit 503 and the averaging circuit 520. The control circuit 501 outputs a digital code value (D[1:M+N]) to the local DAC 502 for performing the successive approximation (binary search) on the analog signal (AVin). As described below, the local DAC 502 performs a DA conversion separately on an upper N-bit and a lower M-bit. Thus, the control circuit 501 separates the digital code value (D[1:M+N]) into an upper bit D[M+1:N] and a lower bit D[1:M], and outputs them to the local DAC 502. In addition, the control circuit 501 stores the digital code value (D[1:M+N]) obtained by performing the successive approximation (binary search) in a successive-approximation register (SAR) 510, and outputs it to the averaging circuit 520.

The local DAC 502 performs the DA conversion on the digital code value (D[1:M+N]) from the control circuit 501 into an analog signal, and outputs the converted signal to the comparator 504. The local DAC 502 has a capacitive DAC (CDAC) as an upper DAC, and a resistive DAC (RDAC) as a lower DAC. The capacitive DAC converts the upper bit D[M+1:N] into an analog signal by a thermometer code control. The resistive DAC performs the DA conversion on the lower bit D[1:M]. A first reference voltage (Vrh) and a second reference voltage (Vrl) are supplied to the local DAC 502. An output of the local DAC 502 is connected to an inverting input terminal of the comparator 504.

The sample-and-hold circuit 503 is configured of a sampling capacitor and an analog switch. The sample-and-hold circuit 503 is a circuit configured to sample the analog signal (AVin) input from the analog multiplexer 51 and hold it during the AD conversion. The sample-and-hold circuit 503 outputs the sampled signal to the comparator 504. The comparator 504 compares outputs of the local DAC 502 and the sample-and-hold circuit 503, and outputs the comparison result to the control circuit 501.

As shown in FIG. 3, the averaging circuit 520 is configured of an accumulator circuit (ACCM) 521, a division circuit (1/n) 522, and a register (RGST) 523. The accumulator circuit 521 is configured of an adder and a register. The conversion value is repeatedly input multiple times (n number of times) from the successive-approximation register 510 of the control circuit 501. Here, n is any integer, and the larger the value given, the more an effect of random noise is reduced without requiring a longer time for correction. The accumulator circuit 521 accumulates the input n number of conversion values to obtain a total value, and outputs it to the division circuit 522. The division circuit 522 divides the input total value by n to calculate the average value of the conversion values, and the average value is retained in the register 523. The register 523 retains the final corrected conversion value.

Figure 4:
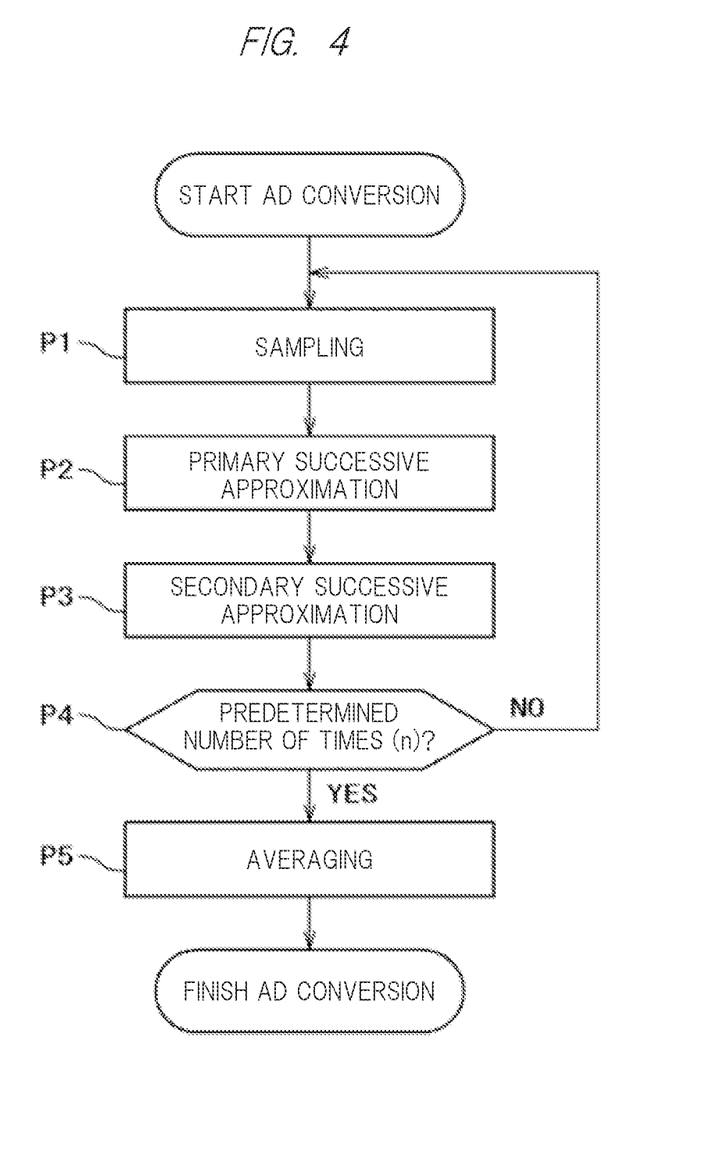
FIG. 4 is a flowchart showing an overview of an operation of the AD converter shown in FIG. 2.

Next, an AD conversion operation of the AD converter in the comparative example will be described with reference to FIGS. 2 to 4. FIG. 4 is a flowchart showing an overview of the operation of the AD converter in the comparative example.

(Sampling: P1)

When performing the AD conversion, first, the AD converter 50 samples the analog input signal (AVin) in the sample-and-hold circuit 503.

(Primary Successive Approximation: P2)

Subsequently, when sampling is finished, the AD converter 50 performs the successive approximation by the upper DAC of the local DAC 502. This successive approximation is referred to as a primary successive approximation. The control circuit 501 sequentially controls a successive-approximation control signal such that a voltage of the upper DAC matches a voltage of the analog signal output from the sample-and-hold circuit 503, and the comparator 504 performs a comparison N number of times.

(Secondary Successive Approximation: P3)

Following the successive approximation by the upper DAC of the local DAC 502, the successive approximation by the lower DAC is performed. This successive approximation is referred to as a secondary successive approximation. The control circuit 501 sequentially controls the successive-approximation control signal, and the comparator 504 performs a comparison M number of times. When the lower DAC is used to perform the comparison M number of times, the AD conversion result of an (N+M) bit is obtained. The control circuit 501 stores the AD conversion result in the successive-approximation register 510. Then, the control circuit 501 outputs the contents of the successive-approximation register 510 to the accumulator circuit 521 of the averaging circuit 520.

(Repeat Predetermined Number of Times: P4)

The control circuit 501 repeats processes P1 to P3 a predetermined number of times (n number of times). As a result, the accumulator circuit 521 accumulates AD conversion values of the n number of times.

(Averaging: P5)

The division circuit 522 of the averaging circuit 520 divides the AD conversion value accumulated by the accumulator circuit 521 by the number of accumulations (n) to calculate the average value, and stores the average value in the register 523. The averaging circuit 520 outputs the corrected conversion value to the data register 53.

The AD converter 50 in the comparative example supplies the conversion value obtained by the AD conversion corresponding to a predetermined analog value to the averaging circuit 520 multiple times, and the averaging circuit 520 calculates the average value of the plurality of conversion values supplied multiple times to calculate the corrected conversion value.

Hereinafter, problems of the AD converter in the comparative example will be described. As described above, the AD conversion by the AD converter in the comparative example includes the sampling (process P1), the primary successive approximation (process P2), the secondary successive approximation (process P3), and the averaging process (process P4). Here, a period of the primary successive approximation is a period in which the upper bit is determined, and a period of the secondary successive approximation is a period in which the lower bit is determined. A period of the averaging process is significantly shorter than the periods of the primary successive approximation and the secondary successive approximation.

Here, when the period of the sampling is t1, the period of the primary successive approximation is t2, the period of the secondary successive approximation is t3, and the average of the AD conversion operation time of n number of times is t, t is expressed by the following equation (1):

$$t = n*(t1+t2+t3) \quad (1)$$

That is, in the AD conversion by the AD converter in the comparative example, the processing time would be n times longer than that of the AD conversion in which the averaging process is not performed.

In the averaging process, the AD conversion is performed on the same input signal (same potential), whereby the second and subsequent sampling processes are unnecessary. In addition, in the successive-approximation AD converter, precision (guaranteed specification) of the AD converter is generally determined by precision of the secondary successive approximation that determines the lower bit.

Thus, in the present embodiment, the averaging process to obtain high precision is such that only the conversion in which the secondary successive approximation for determining the lower bits is repeated is performed, and the primary successive approximation for determining the upper bit is omitted. Hereinafter, the AD converter in the present embodiment will be described in detail.

Figure 5:
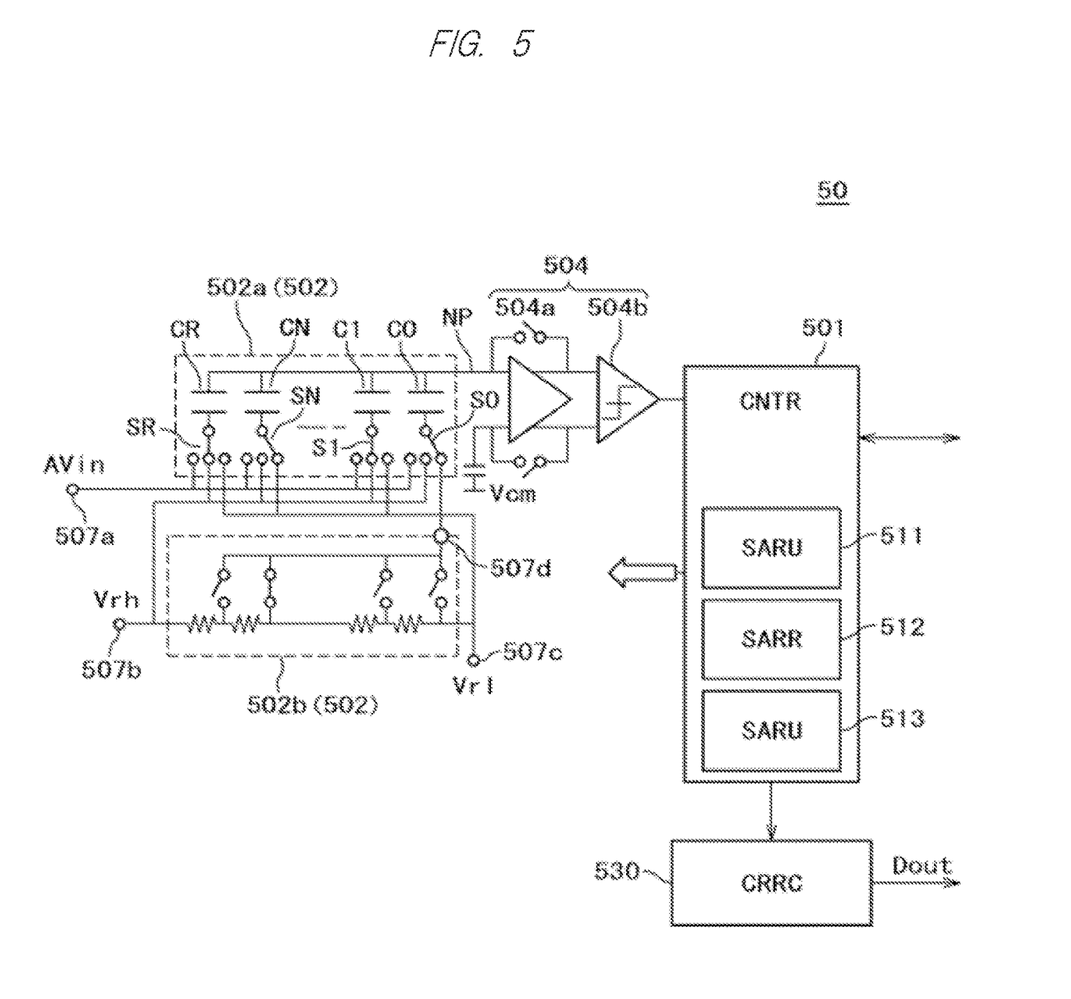
FIG. 5 is a drawing showing a configuration example of the AD converter in the embodiment.

Here, a configuration of the AD converter in the present embodiment will be described with reference to FIG. 5. FIG. 5 is a drawing showing a configuration example of the successive-approximation AD converter in the present embodiment.

The successive-approximation AD converter 50 in the present embodiment comprises the control circuit (CNTR) 501, the local DAC 502, the comparator 504, and a correction circuit (CRRC) 530.

The local DAC 502 is configured of a capacitive DAC 502a and a resistive DAC 502b. The capacitive DAC 502a is configured of an upper DAC corresponding to the upper DAC in the comparative example, and a redundant DAC not present in the comparative example. The resistive DAC 502b corresponds to the lower DAC in the comparative example.

The capacitive DAC 502a is a DAC configured to sample the analog input signal and redistribute the sampled charge. The capacitive DAC 502a also serves as a sampling circuit. The capacitive DAC 502a comprises a plurality of capacitors CN, ..., C0, CR, and a plurality of switches SN, ..., S0, SR.

The plurality of capacitors CN, ..., C0, CR are connected in parallel between a node NP and the plurality of switches SN, ..., S0, SR. Here, the node NP is a node connected to one of the input terminals of a pre-amplifier 504a of the comparator 504. The switches SN, ..., S1 are connected between the capacitors CN, ..., C1 and an input terminal 507a of the analog input signal (AVin), a supply terminal 507b of the first reference voltage (Vrh) and a supply terminal 507c of the second reference voltage (Vrl). The switch S0 is connected between the capacitor C0 and the input terminal 507a of the analog input signal (AVin), the supply terminal 507b of the first reference voltage (Vrh) and an output terminal 507d of the resistive DAC 502b. The switch SR is connected between the capacitor CR and the input terminal 507a of the analog input signal (AVin), the supply terminal 507b of the first reference voltage (Vrh) and the supply terminal 507c of the second reference voltage (Vrl).

Switching of the switches SN, ..., S0, SR are respectively controlled by a plurality of successive-approximation control signals that are outputs of the control circuit 501. The switches SN, ..., S1, SR switch the connections between the capacitors CN, ..., C1, CR and the first reference voltage (Vrh), the second reference voltage (Vrl) and the analog input signal (AVin) according to the plurality of successive-approximation control signals. The switch S0 switches the connection between the capacitor C0 and the analog input signal (AVin), the first reference voltage (Vrh) and an output signal of the resistive DAC 502b according to the successive-approximation control signal.

The resistive DAC 502b is an M-bit DAC configured to perform the DA conversions on the plurality of successive-approximation control signals that are outputs of the control circuit 501, and supply the DA-converted analog signal to the capacitor C0 via the switch S0. The resistive DAC 502b (and the capacitor C0) performs the DA conversion corresponding to the lower bit (M-bit) of the digital output signal. The capacitor (coupling capacitor) C0 and the switch (coupling switch) S0 may or may not be included in the resistive DAC 502b. The capacitor C0 is a reference capacitor and its capacitance is denoted by Ck. The capacitance is the same as that of the capacitor of the least significant bit of the upper DAC.

The upper DAC is an N-bit DAC, and comprises the capacitors CN, ..., C1 (upper capacitor group) and the switches SN, ..., S1 (upper switch group). The capacitors CN, ..., C1 each have a capacitance weighted by the reference capacitor C0 to the power of 2. In other words, the capacitance of the capacitor C1 at a lowest bit position is Ck, and the capacitance of the capacitor CN at a highest bit position is $2^{N-1} \times Ck$. The upper DAC samples the analog input signal (AVin) and performs the DA conversion corresponding to the upper bit (N-bit) of the digital output signal according to the successive-approximation control signal.

The redundant DAC is a 1-bit DAC for providing redundancy to the least significant bit of the upper DAC, and comprises the capacitor (redundant capacitor) CR and the switch (redundant switch) SR. The capacitor CR corresponds to the least significant bit of the upper DAC and has the same capacitance as the capacitor C1. That is, the capacitance of the capacitor CR is set to Ck.

The comparator 504 is configured of the pre-amplifier 504a and a binarization circuit 504b. The comparator 504 compares a reference voltage (Vcm) and output voltages of the capacitive DAC 502a and the resistive DAC 502b. The comparator 504 has one input terminal connected to the capacitors CN, . . . , C0, CR, the other input terminal connected to the reference voltage (Vcm), and the output terminal connected to the control circuit 501. The pre-amplifier 504a has a switch connected between one input terminal (node NP) and one output terminal, and a switch connected between the other input terminal (reference voltage (Vcm)) and the other output terminal. For example, the switch of the pre-amplifier 504a is turned on or off by the control circuit 501. At the time of the sampling operation, the switch of the pre-amplifier 504a is turned on, whereby the comparator 504 does not perform any comparison. At the time of a successive approximation operation, the switch is turned off, whereby the comparator 504 compares the charge redistributed by the capacitors CN, . . . , C0, CR and the reference voltage (Vcm), and outputs the comparison result to the control circuit 501.

The control circuit 501 controls the successive approximation by the successive-approximation control signal based on the comparison result of the comparator 504. The control circuit 501 stores an N-bit AD conversion result which is a digital output signal in an upper register (SARU) 511 and outputs it to the correction circuit 530 according to the result of the successive approximation by the upper DAC. In addition, the control circuit 501 stores the 1-bit AD conversion result which is a digital output signal in a redundant register (SARR) 512 and outputs it to the correction circuit 530 according to the result of the successive approximation by the redundant DAC. In addition, the control circuit 501 outputs an M-bit AD conversion result which is a digital output signal to the correction circuit 530 according to the result of the successive approximation by the lower DAC.

Figure 6:
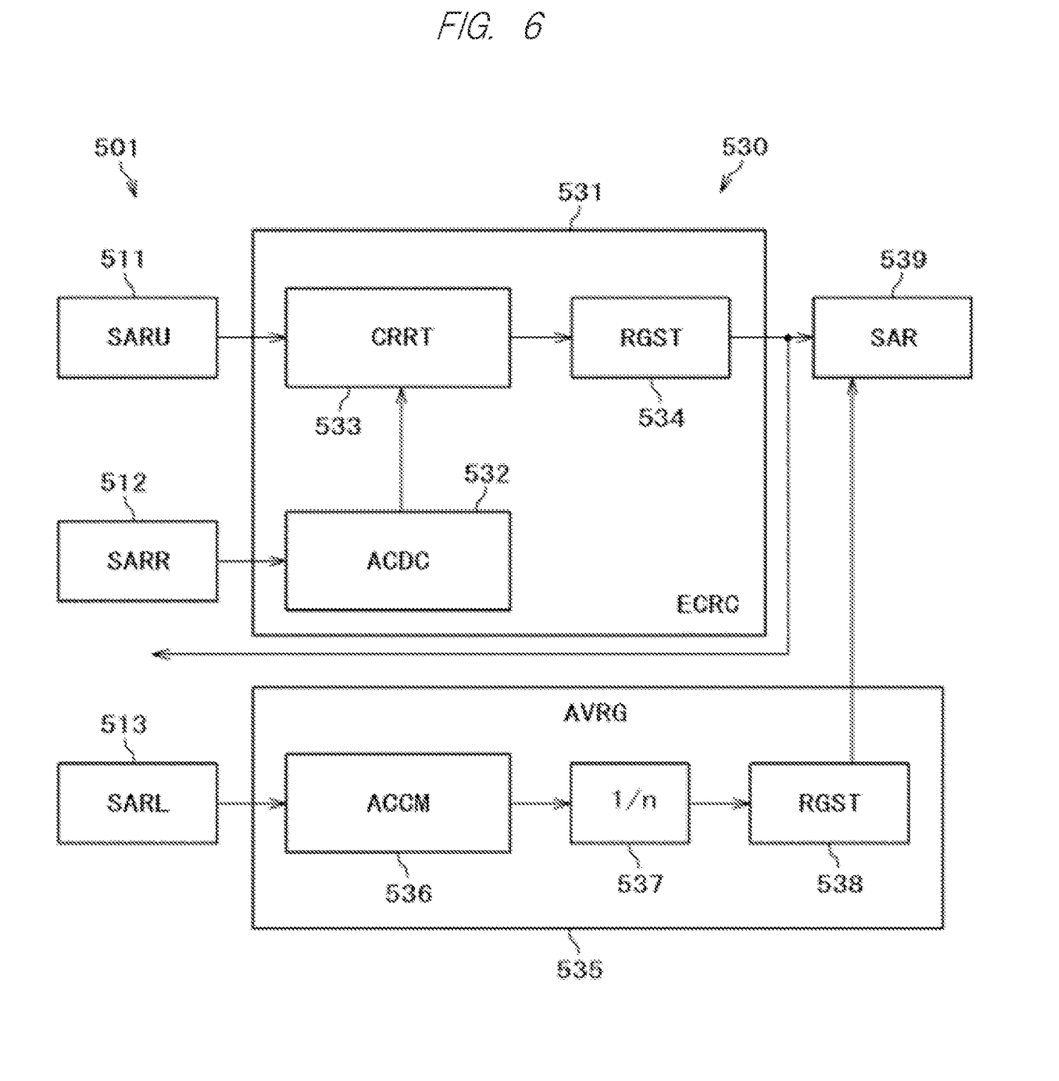
FIG. 6 is a block diagram showing a configuration example of a correction circuit shown in FIG. 5.

Hereinafter, a configuration of the correction circuit will be described with reference to FIG. 6. FIG. 6 is a block diagram showing a configuration example of the correction circuit shown in FIG. 5.

The correction circuit 530 comprises an error correction circuit (ECL) 531, an averaging circuit (AVRG) 535, and a successive-approximation register (SAR) 539.

The error correction circuit (ECL) 531 is configured of an appearance-count determination circuit (ACDC) 532, a correction circuit (CRRT) 533, and a register (RGST) 534. In the appearance-count determination circuit 532, the conversion value is repeatedly input multiple times (m number of times) from the redundant register 512 of the control circuit 501. Here, m is an odd number of 3 or more, and the larger the value given, the more the effect of random noise is reduced without requiring a longer time for correction. The appearance-count determination circuit 532 counts the number of times "1" and "0" representing the input m number of conversion values appeared, and outputs the value with the larger number of appearances. The correction circuit 533 corrects the least significant bit of the conversion value input from the upper register 511 of the control circuit 501 to the value output from the appearance-count determination circuit 532.

The averaging circuit 535 has a configuration similar to that of the averaging circuit 520 in the comparative example, and is configured of an accumulator circuit (ACCM) 536, a division circuit (1/n) 537, and a register (RGST) 538. The accumulator circuit 536 is configured of an adder and a register. The conversion value is repeatedly input multiple times (n number of times) from a lower register (SARL) 513 of the control circuit 501. Here, n is any integer. The accumulator circuit 536 accumulates the input n number of conversion values to obtain a total value, and outputs it to the division circuit 537. The division circuit 537 divides the input total value by n to calculate the average value of the conversion values, and the average value is retained in the register 538. The register 538 retains the final corrected conversion value.

Figure 7:
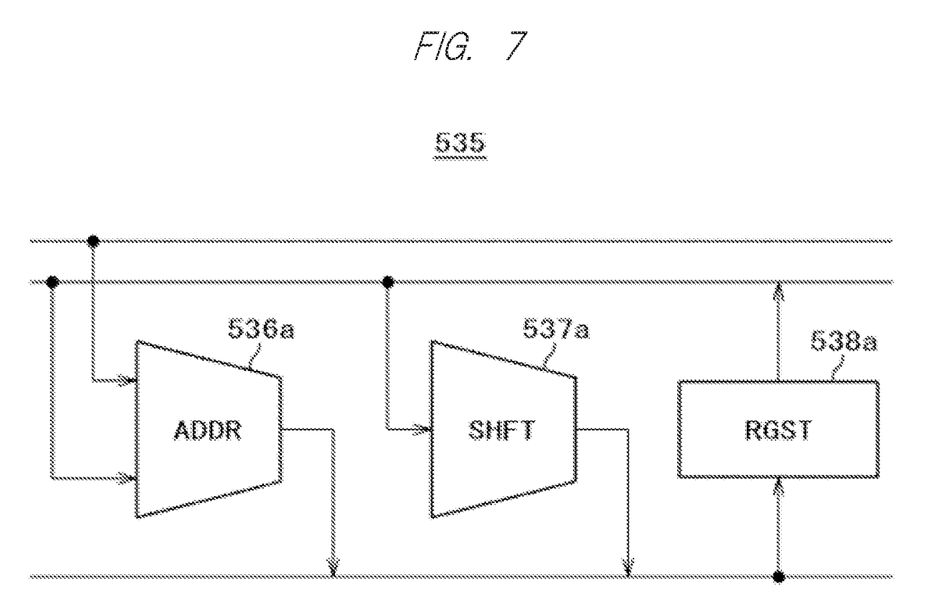
FIG. 7 is a block diagram showing a configuration example of an averaging circuit shown in FIG. 6.

When n is limited to a power of 2, the division circuit 537 can be configured of a bit shift circuit. Hereinafter, a configuration of the averaging circuit 535 in such a case will be described with reference to FIG. 7. FIG. 7 is a block diagram showing a configuration example of the averaging circuit.

The averaging circuit 535 is configured of an adder (ADDR) 536a, a bit shift circuit (SHFT) 537a, and a register (RGST) 538a. The accumulator circuit 536 is configured of the adder 536a and the register 538a. The register 538a has a function to clear the contents.

Figure 8:
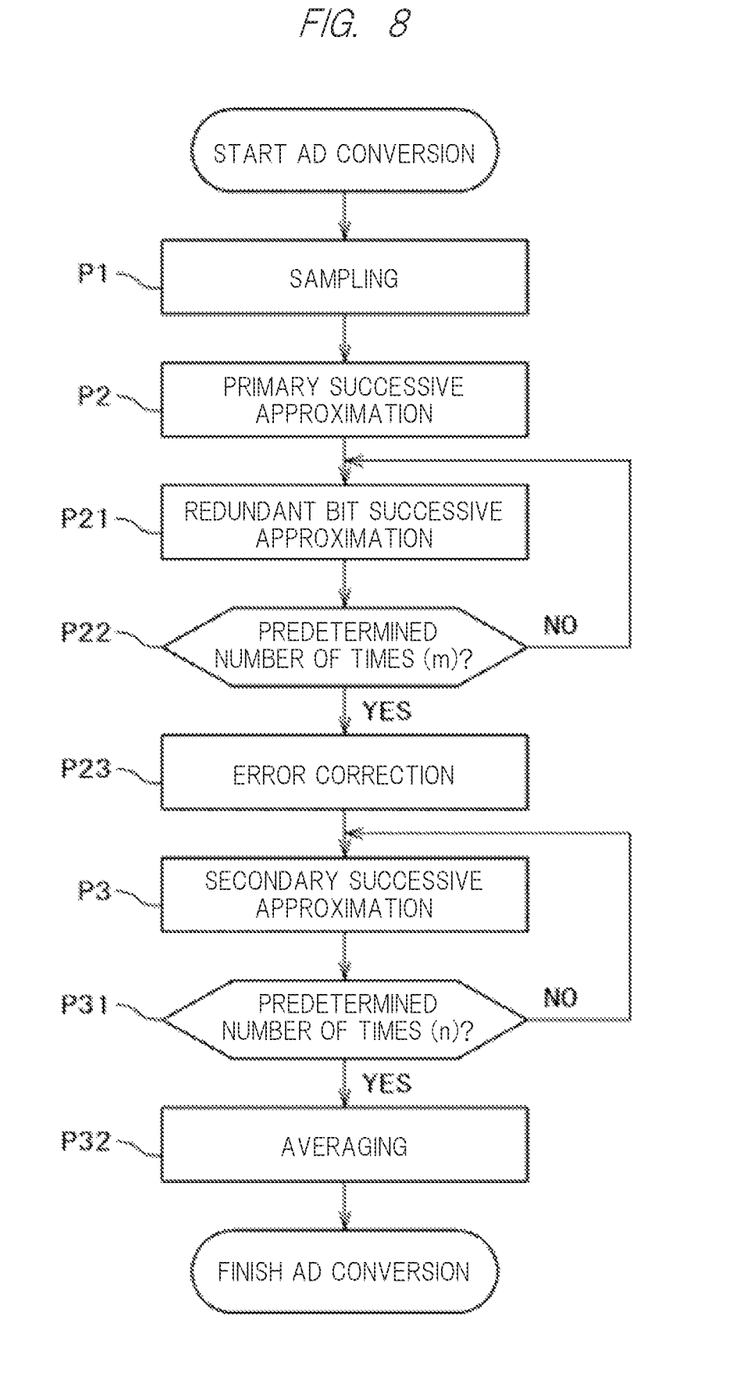
FIG. 8 is a flowchart showing an overview of an operation of the AD converter shown in FIG. 5.

Next, the AD conversion operation in the present embodiment will be described with reference to FIGS. 5 to 8. FIG. 8 is a flowchart showing an overview of an operation of the AD converter in the present embodiment.

(Sampling: P1)

When performing the AD conversion, first, the AD converter 50 samples the analog input signal (AVin). At the time of the sampling, the switches SN, . . . , S0 all select an analog input side by control of the successive-approximation control signal. In addition, the switch of the pre-amplifier 504a is turned on, whereby the node NP is connected to an output of the pre-amplifier 504a. At this time, the capacitor CR of the redundant DAC selects the analog input side.

(Primary Successive Approximation: P2)

Subsequently, when sampling is finished, the AD converter 50 performs the successive approximation operation. When sampling is finished, the switch of the pre-amplifier 504a is turned off, whereby the node NP is disconnected from the output of the pre-amplifier 504a. Then, the AD converter 50 transitions to a successive-approximation state, the control circuit 501 controls the successive-approximation control signal to an initial comparison code, and the switches SN, . . . , S0 are switched according to the initial comparison code. For example, in a case where an initial comparison voltage starts from (VrefH−VrefL)/2, the switch SN is set to the VrefH side, and the remaining switches SN−1, . . . , S0 are set to the VrefL side. At this time, the switch SR is set to the reference voltage (VrefL) side.

The control circuit 501 sequentially controls the successive-approximation control signal such that the voltage of the node NP matches the reference voltage (Vcm), and the comparator 504 performs the comparison N number of times. When the upper DAC is used in this manner to perform the comparison N number of times, the N-bit AD conversion result is obtained. This AD conversion result is stored in the upper register 511.

(Redundant Bit Successive Approximation: P21; Determination of Number of Comparisons: P22)

Subsequently, when the primary successive approximation is finished and if the comparison result of the comparator 504 (voltage of node NP<reference voltage (Vcm)) is detected, the control circuit 501 switches the successive-approximation control signal such that the setting of switch SR transitions from the second reference voltage (Vrl) to the first reference voltage (Vrh). In addition, if the comparison result of the comparator 504 (voltage of node NP>reference voltage (Vcm)) is detected, the control circuit 501 maintains the setting of the switch SR at the second reference voltage (Vrl), and the successive approximation by the redundant DAC is performed m number of times.

(Error Correction: P23)

After the redundant bit successive approximation is performed m number of times, the relevant bit is determined by the number of appearances, and an error determination of the comparator at the upper bit level is corrected. Details will be described below.

(Secondary Successive Approximation: P3; Determination of Number of Comparisons: P31)

Following the error correction by the redundant DAC, the successive approximation by the lower DAC 502b connected to the capacitor C0 is performed. This successive approximation is referred to as the secondary successive approximation. The successive-approximation control signal sets the output of the lower DAC 502b to a value of (Vrh−Vrl)/2. The control circuit 501 sequentially controls the successive-approximation control signal, and the comparator 504 performs the comparison M number of times. When the lower DAC 502b is used in this manner to perform the comparison M number of times, the M-bit AD conversion result is obtained. This AD conversion result is stored in the lower register 513. Then, the control circuit 501 outputs the contents of the lower register 513 to an accumulator circuit 541 of an averaging circuit 540.

The control circuit 501 repeats the process P3 n number of times. As a result, the accumulator circuit 521 accumulates the AD conversion values of the n number of times.

(Averaging Process: P32)

The division circuit 537 of the averaging circuit 535 divides the AD conversion value accumulated by the accumulator circuit 536 by the number of accumulations (n) to calculate the average value, and stores the average value in the register 538. The averaging circuit 535 merges the corrected conversion value into the lower bit of the successive-approximation register 539.

Next, reasons for why it is preferable to provide the redundant DAC will be described. As a comparative example, the following problems arise when a configuration without the redundant DAC as provided in the present embodiment is considered.

Figure 9:
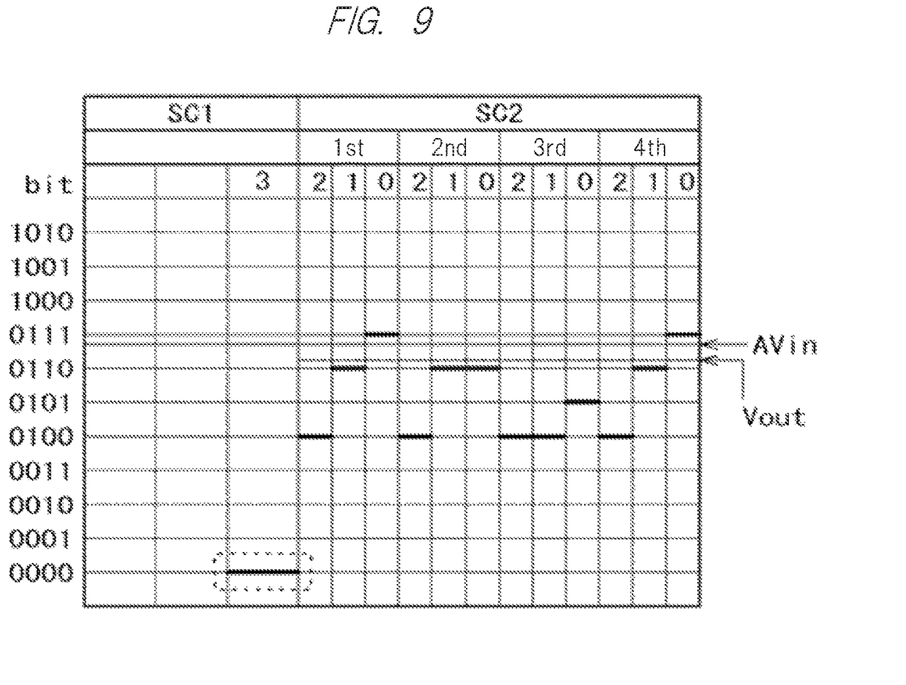
FIG. 9 is a drawing showing a digital code transition in a correct AD conversion in a case of the comparative example without a redundant DAC.
Figure 10:
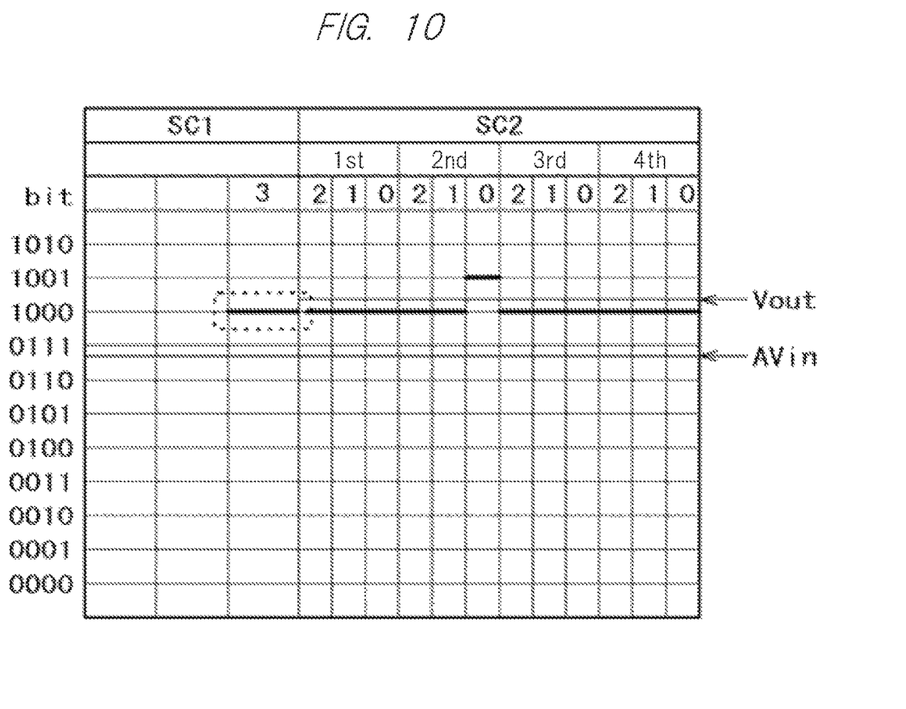
FIG. 10 is a drawing showing a digital code transition in an incorrect AD conversion in a case of the comparative example without the redundant DAC.

For example, a case of transitioning of a digital code in the AD conversion with a lower DAC of 3 bits (M=3) is considered. FIG. 9 is a drawing showing a digital code transition in the AD conversion for the comparative example with no redundant DAC and in a case where bit 3 of the least significant bit of the upper DAC is correct. FIG. 10 is a drawing showing the digital code transition in the AD conversion for the comparative example with no redundant DAC and in a case where bit 3 of the least significant bit of the upper DAC is incorrect. The following description is based on a case where the averaging process is performed four times in the secondary successive approximation (SC2).

First, a case where the least significant bit of the upper DAC is correct which is the result of the primary successive approximation (SC1) will be described. As shown in FIG. 9, bit 3 which is the least significant bit of upper DAC is "0" and is correct data. In the first secondary successive approximation (SC2), bit 2 is "1", bit 1 is "1", and bit 0 is "1". In the second secondary successive approximation (SC2), bit 2 is "1", bit 1 is "1", and bit 0 is "0". In the third secondary successive approximation (SC2), bit 2 is "1", bit 1 is "0", and bit 0 is "1". In the fourth secondary successive approximation (SC2), bit 2 is "1", bit 1 is "1", and bit 0 is "1". These are averaged to obtain an output potential (Vout). This ensures that the output potential (Vout) is equivalent to the analog input signal (AVin), and that an ideal input signal potential can be obtained.

Next, a case where the least significant bit of the upper DAC is incorrect will be described. As shown in FIG. 10, bit 3 which is the least significant bit of the upper DAC is "1" and is incorrect data. In the first secondary successive approximation (SC2), bit 2 is "0", bit 1 is "0", and bit 0 is "0". In the second secondary successive approximation (SC2), bit 2 is "0", bit 1 is "0", and bit 0 is "1". In the third secondary successive approximation (SC2), bit 2 is "0", bit 1 is "0", and bit 0 is "0". In the fourth secondary successive approximation (SC2), bit 2 is "0", bit 1 is "0", bit 0 is "0". These are averaged to obtain an input signal potential (Vavr). However, if the least significant bit of the DAC is incorrect, the output potential (Vout) would not be close to the analog input signal (AVin) even after the averaging is performed.

Figure 11:
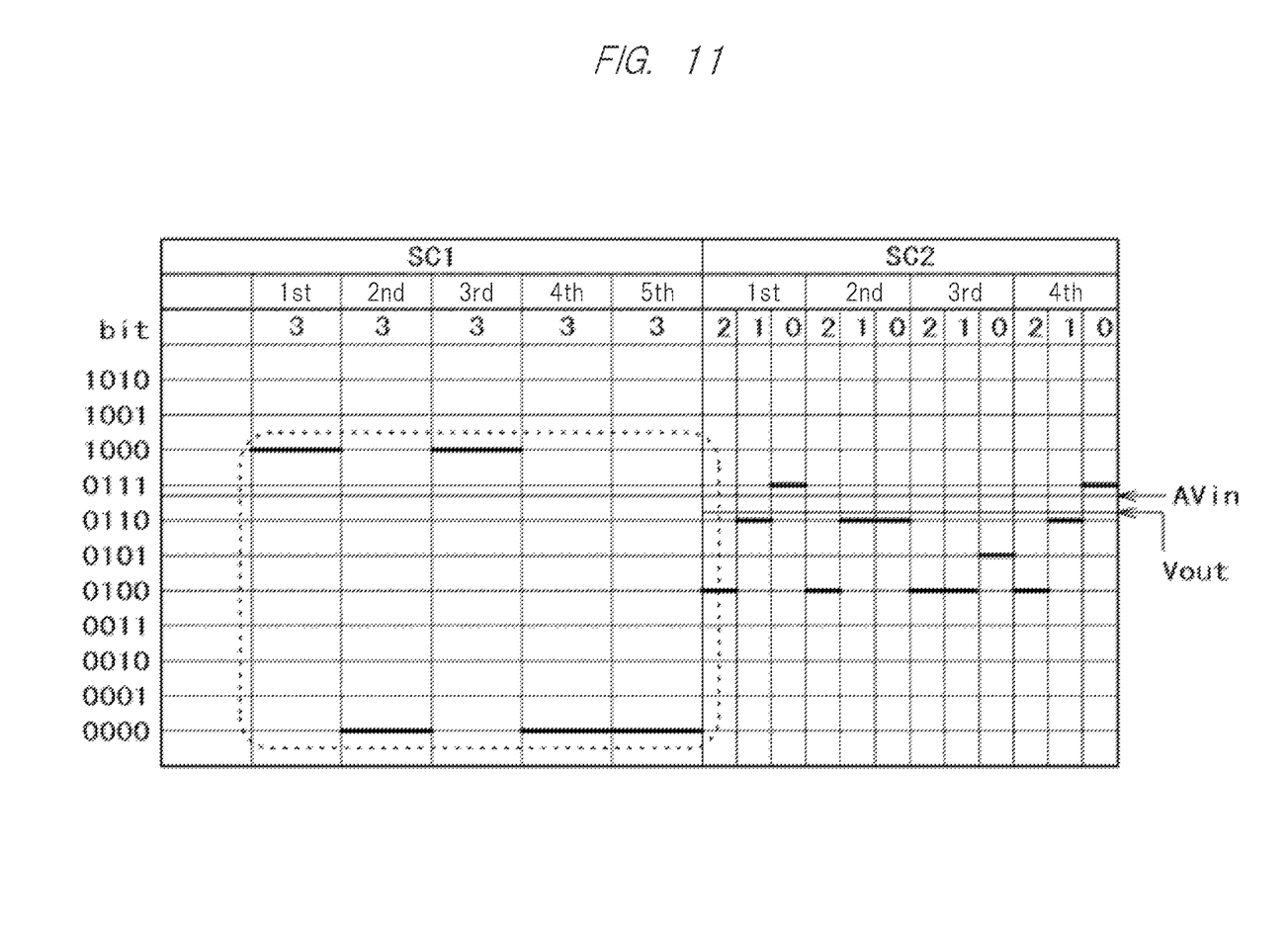
FIG. 11 is a drawing showing a digital code transition in an AD conversion in a case of the embodiment with the redundant DAC.

FIG. 11 is a drawing showing the digital code transition in the AD conversion in a case of the present embodiment having the redundant DAC.

Determination is performed on the least significant bit of the upper DAC in the primary successive approximation (SC1) multiple times by the redundant DAC to retrieve the least significant bit. As shown in FIG. 11, for bit 3 which is the least significant bit of the upper DAC, the first determination result is "1", the second determination result is "0", the third determination result is "1", the fourth determination result is "0", and the fifth determination result is "0". Determination of "0" is made three times, and determination of "1" is made twice. The data of bit 3 is determined according to which of "0" or "1" appeared more. In the present example, the data of bit 3 is set to "0" since the number of times "0" appeared is greater. In this manner, it is possible to reduce errors in the least significant bit of the upper DAC.

As a result, the secondary successive approximation (SC2) is performed in a similar manner as shown in FIG. 9, the output potential (Vout) becomes equivalent to the analog input signal (AVin), and an ideal input signal potential can be obtained. Therefore, it is preferable to correct the least significant bit of the upper DAC by the redundant DAC.

Figure 12:
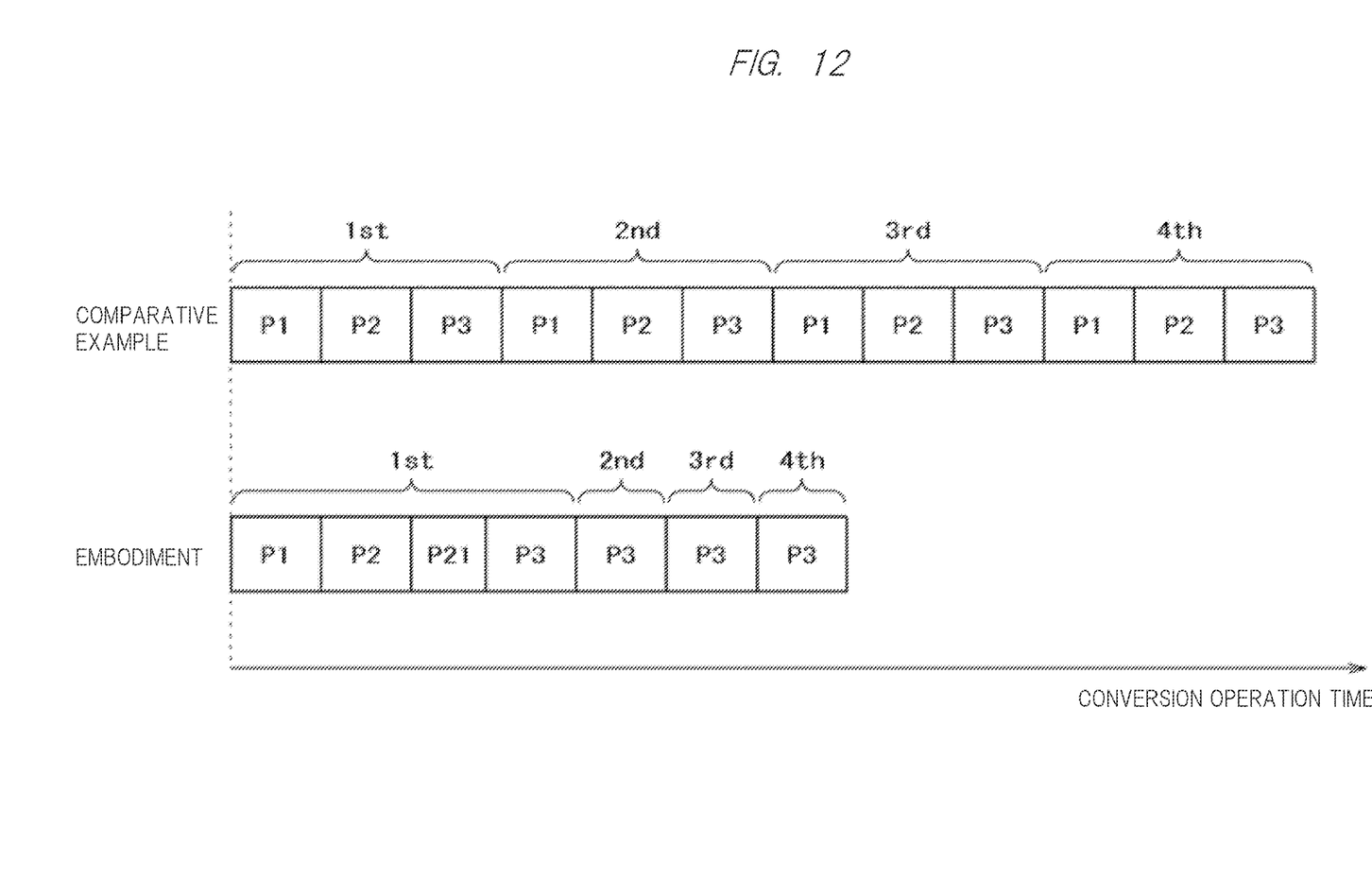
FIG. 12 is a drawing describing conversion operation times in the comparative example and the embodiment.

Hereinafter, effects of the present embodiment will be described with reference to FIGS. 4, 8 and 12. FIG. 12 is a drawing describing conversion operation times in the comparative example and the present embodiment.

In the comparative example, as shown in FIG. 4, in order to obtain highly precise AD conversion results, the sampling, the primary successive approximation and the secondary successive approximation are performed a predetermined number of times (n number of times), and then the averaging process is performed. In contrast, in the present embodiment, as shown in FIG. 8, only the secondary successive approximation operation to determine the lower bit is repeatedly performed. Further, after the primary successive approximation, the redundant bit successive approximation is executed m number of times, the relevant bit is determined by the number of appearances, and the error determination of the comparator at the upper bit level is corrected. In the present embodiment, the period of the sampling, the period of the primary successive approximation and the period of the redundant bit successive approximation are omitted in the second and subsequent AD conversions, whereby the AD conversion operation time of the averaging process can be significantly shortened. Here, the averaging process is performed only for the lower bit side (secondary successive approximation), whereby sampling errors and systematic variations of the DAC remain, but a false determination of the comparator on the secondary successive approximation side and a false determination caused by voltage fluctuations in the power supply line can be suppressed as much as possible.

Here, when the period of the sampling is t1, the period of the primary successive approximation is t2, the period of the secondary successive approximation is t3, the period of the redundant bit successive approximation is t4, and the average of the AD conversion operation time of n number of times is t, t is expressed by the following equation (2):

$$t=t1+t2+t4+n*t3 \qquad (2)$$

As shown in FIG. 12, a method which uses the AD converter capable of successively performing the AD conversions to perform the AD conversion four times and which obtains the average is given as an example.

In the comparative example, from the above-described equation (1), the AD conversion operation time (t) is obtained by:

$$t=4*(\text{period of } P1(t1)+\text{period of } P2(t2)+\text{period of } P3(t3)).$$

In the present embodiment, from the above-described equation (2), the AD conversion operation time (t) is obtained by:

$$t=\text{period of } P1(t1)+\text{period of } P2(t2)+\text{period of } P4(t4)+4*(\text{period of } P3(t3)).$$

As shown in FIG. 12, the present embodiment can have a shorter conversion operation time than the comparative example.

Another more specific example is as follows. For example, when n=16, t1=15 (cycles), t2=10 (cycles), t4=3 (cycles) and t3=7 (cycles), the following is obtained:
from the above-described equation (1) for the comparative example, t=560 (cycles); and
from the above-described equation (2) for the present embodiment, t=140 (cycles).

The conversion operation time of the present embodiment is one-fourth of the conversion operation time of the comparative example.

In the foregoing, the present invention conceived by the present inventors has been concretely described based on the embodiment. However, the present invention is not limited to the foregoing embodiment, and various modifications and alterations can be made within the scope of the present invention.

What is claimed is:

1. A semiconductor device comprising:
a port to which an analog input signal is input; and
a successive-approximation analog-to-digital converter configured to perform a process of sampling the analog input signal input to the port and a successive-approximation process, execute an analog-to-digital conversion process, and output a digital output signal,
wherein the analog-to-digital converter comprises:
an upper DAC configured to perform a digital-to-analog conversion corresponding to an upper bit of the digital output signal;
a redundant DAC configured to perform a digital-to-analog conversion corresponding to a redundant bit added to a bit of the upper DAC;
a lower DAC configured to perform a digital-to-analog conversion corresponding to a lower bit of the digital output signal;
a comparator configured to compare a comparative reference voltage and output voltages of the upper DAC, the redundant DAC and the lower DAC;
a control circuit configured to control successive approximations by the upper DAC, the redundant DAC and the lower DAC based on a comparison result of the comparator, and generate the digital output signal; and
a correction circuit configured to correct the digital output signal, and
wherein the correction circuit comprises:
an error correction circuit configured to correct an error of the upper bit with the redundant bit; and
an averaging circuit configured to calculate an average value of conversion values of a plurality of the lower bits supplied multiple times.

2. The semiconductor device according to claim 1, wherein the control circuit is configured to:
convert a predetermined analog input signal into a digital output signal by successive approximation by the upper DAC, and store a conversion value in an upper successive-approximation register;
convert the predetermined analog input signal into a digital output signal by successive approximation by the redundant DAC, and store a conversion value in a redundant successive-approximation register;
supply a conversion value from the redundant successive-approximation register to the error correction circuit multiple times;
convert the predetermined analog input signal into a digital output signal by successive approximation by the lower DAC, and store a conversion value in a lower successive-approximation register; and
supply a conversion value from the lower successive-approximation register to the averaging circuit multiple times.

3. The semiconductor device according to claim 2, wherein the error correction circuit is configured to correct a least significant bit of the digital output signal stored in the upper successive-approximation register based on a number of appearances of a plurality of conversion values supplied from the redundant successive-approximation register.

4. The semiconductor device according to claim 3, wherein the control circuit is configured to perform conversion into a digital output signal by successive approximation by the lower DAC based on the corrected least significant bit.

5. The semiconductor device according to claim 1, further comprising:
a central processing unit; and
a memory in which a program the central processing unit executes is stored.

6. A successive-approximation analog-to-digital converter configured to perform a process of sampling an analog input signal and a successive-approximation process, execute an analog-to-digital conversion process, and output a digital output signal,
wherein the analog-to-digital converter comprises:
an upper DAC configured to perform a digital-to-analog conversion corresponding to an upper bit of the digital output signal;
a redundant DAC configured to perform a digital-to-analog conversion corresponding to a redundant bit added to a bit of the upper DAC;

a lower DAC configured to perform a digital-to-analog conversion corresponding to a lower bit of the digital output signal;

a comparator configured to compare a comparative reference voltage and output voltages of the upper DAC, the redundant DAC and the lower DAC;

a control circuit configured to control successive approximations by the upper DAC, the redundant DAC and the lower DAC based on a comparison result of the comparator, and generate the digital output signal; and a correction circuit configured to correct the digital output signal, and wherein the correction circuit comprises:

an error correction circuit configured to correct an error of the upper bit with the redundant bit; and an averaging circuit configured to calculate an average value of conversion values of a plurality of the lower bits supplied multiple times.

7. An analog-to-digital converting method of an analog-to-digital converter comprising: an upper DAC configured to perform a digital-to-analog conversion corresponding to an upper bit of a digital output signal; a redundant DAC configured to perform a digital-to-analog conversion corresponding to a redundant bit added to a bit of the upper DAC; and a lower DAC configured to perform a digital-to-analog conversion corresponding to a lower bit of the digital output signal, the analog-to-digital converting method including:

a primary successive approximation step in which an analog input signal is converted into a digital output signal by successive approximation by the upper DAC;

a redundant successive approximation step in which the analog input signal is converted into a digital output signal by successive approximation by the redundant DAC;

an error correction step in which an error in the primary successive approximation step is corrected based on results obtained in the redundant successive approximation step performed multiple times;

a secondary successive approximation step in which the analog input signal is converted into a digital output signal by successive approximation by the lower DAC; and an averaging step in which results obtained in the secondary successive approximation step performed multiple times are averaged.

* * * * *